United States Patent [19]

Morofuji

[11] Patent Number: 5,441,474
[45] Date of Patent: Aug. 15, 1995

[54] PCB WORKING MACHINE AND METHOD

[75] Inventor: Yoshihisa Morofuji, Hino, Japan

[73] Assignees: Osaki Engineering Co., Ltd, Shinugawa; Pioneer Electric Corporation, Tokyo, both of Japan

[21] Appl. No.: 155,444

[22] Filed: Nov. 19, 1993

[30] Foreign Application Priority Data

Nov. 25, 1992 [JP] Japan .................... 4-315000

[51] Int. Cl.⁶ .................. B23B 35/00; B23C 9/00; H05K 3/00

[52] U.S. Cl. ......................... 483/55; 408/1 R; 408/67; 408/95; 408/13; 409/132; 409/137; 409/185; 483/1

[58] Field of Search ............ 483/1, 58, 60, 54, 57, 483/55, 53; 409/131, 132, 136, 137, 235, 190, 195, 185; 408/95, 1 R, 67, 13

[56] References Cited

U.S. PATENT DOCUMENTS

| | | | |
|---|---|---|---|
| 3,973,863 | 8/1976 | Smith | 483/55 |
| 4,340,326 | 7/1982 | Buonauro et al. | 409/137 X |
| 4,530,627 | 7/1985 | Kosmowski | 409/235 X |
| 4,865,494 | 9/1989 | Gudow | 408/95 X |
| 4,984,352 | 1/1991 | Reed et al. | 409/137 X |
| 5,024,562 | 6/1991 | Arai et al. | 408/95 X |
| 5,066,171 | 11/1991 | Arai et al. | 408/95 X |
| 5,087,156 | 2/1992 | Kanaya et al. | 408/95 X |
| 5,094,574 | 3/1992 | Nishigai et al. | 409/132 |
| 5,123,789 | 6/1992 | Ohtani et al. | 408/95 |
| 5,139,376 | 8/1992 | Pumparey | 408/95 X |
| 5,302,166 | 4/1994 | Marantette et al. | 483/53 X |
| 5,308,198 | 5/1994 | Pumphrey | 408/95 X |
| 5,332,343 | 7/1994 | Watanabe et al. | 409/136 |

*Primary Examiner*—William Briggs
*Attorney, Agent, or Firm*—Anderson Kill Olick & Oshinsky

[57] ABSTRACT

A PCB working machine includes a work table for holding a PCB substrate in place with a suction force; a spindle carrying a cutting tool; a controller for moving the spindle in accordance with a predetermined pattern; a collet chuck provided at a distal end of the spindle for clamping the cutting tool; a floating head encircling said collet chuck at a distant position and having an end plate in which a plurality of air blowing holes are provided; and an adjuster for adjusting the positional relationship between the floating head and the cutting tool.

4 Claims, 6 Drawing Sheets

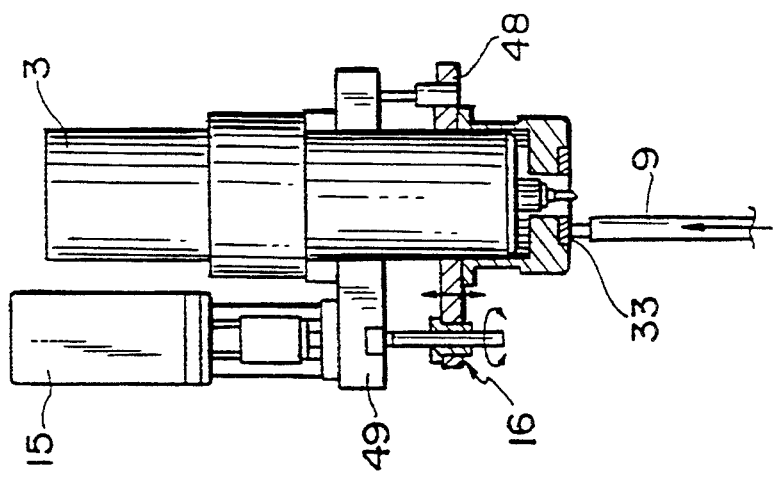
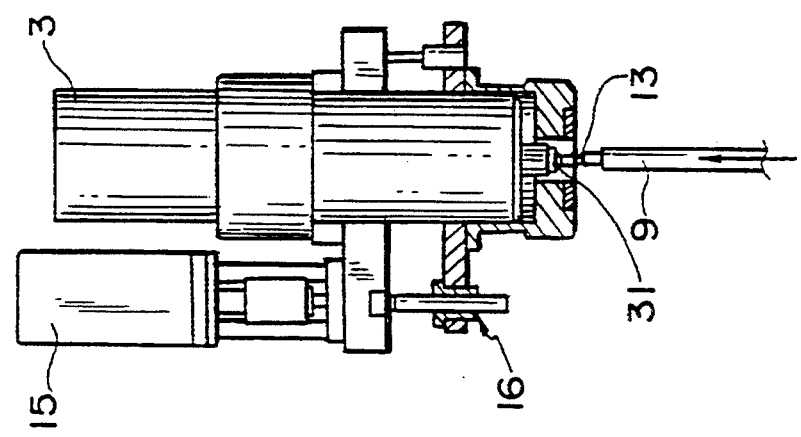
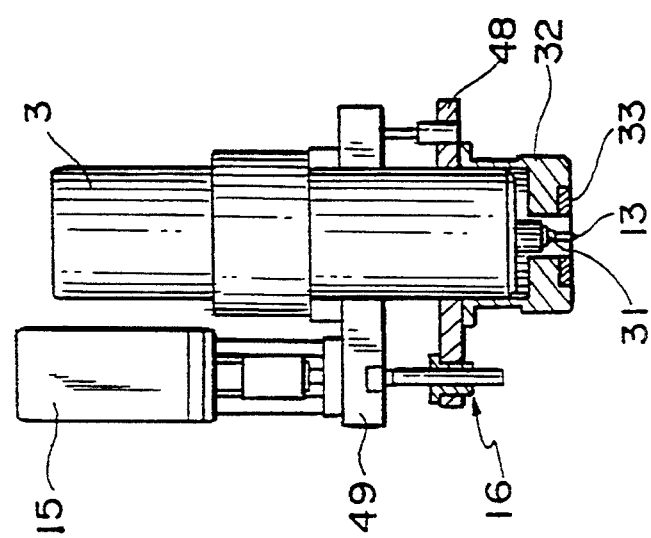

PCB WORKING MACHINE AND METHOD

BACKGROUND OF THE INVENTION

1. Field of the Invention

This invention relates to a working machine for trial construction of a printed circuit board (hereinafter called a PCB) by effecting some kinds of working, such as making a circuit pattern on a copper-foiled substrate, making holes in lands, and so on, in accordance with geometrical data made by a CAD.

2. Description of the Prior Art

In order to develop electronic devices and to fabricate such devices that are small in amount of production and hence not suitable for mass production, there is an increasing need for constructing PCB substrates with appropriate electronic circuits on a trial basis, precisely, quickly, and at a low cost,.

However, since trial construction of PCBs needs steps of photographic, chemical, and other treatments, circuit patterns must be made even for fabricating a small amount of trial PCBs, and most of planners, designers and other engineers have been compelled to order such work to specialists.

In order to improve the situation, there has been proposed a PCB working machine for making a circuit pattern by cutting a copper-foiled substrate in which a copper layer is provided on an insulating substrate.

More specifically, such PCB working machines are configured such that a cutting tool is fixed to a spindle moveable in X-axis and Y-axis directions under a control, and it is moved, in accordance with a predetermined pattern, on a PCB substrate which is held in place on a work table with a suction force, to cut the copper layer and the insulating substrate on the PCB substrate to make a target circuit.

In the PCB working machines referred to above, the cutting tool has, at its distal end, a pyramid-shaped cutting edge with a 90 degrees apex, for example, and the cutting tool is fixed to a chuck provided at a distal end of a spindle. Thus the cutting tool is rotated and moved down by a controlled amount onto a PCB substrate by a stepping motor, and then moved in X-axis and Y-axis directions to cut the surface of the PCB substrate into a circuit board having a desired pattern.

In the working machines having the foregoing construction, after the cutting tool is fixed to the chuck at the distal end of the spindle, the cutting edge of the cutting tool is brought into contact with the surface of the PCB substrate to detect the position of the surface of the PCB substrate. After that, the spindle is driven to move down by a necessary amount by a stepping motor for Z-axis movements such that the cutting edge of the cutting tool cuts into the surface of the PCB substrate by a precise depth. That is, the widths of cuts are controlled in the foregoing process.

This method, however, is likely to cause errors in level of the cutting edge of the cutting tool relative to the level of the surface of the PCB substrate, because of a microscopic unevenness of the surface of the PCB substrate or displacement of the spindle caused by heat. In case of a 90°-angled cutting edge, the error in width of a cut will be as large as twice an error in level of the cutting edge (Z-axis direction). This is a serious problem in making a circuit pattern with microscopically distant lines.

The aforementioned method also involves a problem such that shavings may remain on the worked surface. Such shavings, if remaining on the worked surface, may cause a short-circuit between lines or cut and break the circuit pattern.

Cutting tools are subject to breakage. When such breakage occurs during automatic driving of the machine, it results in defective cuts.

Moreover, in the working machines having the above-described construction, the cutting tool is likely to stick to the chuck, and it has been difficult to automate replacement of the tool with another. Therefore, unmanned driving of such machines during night has been difficult.

OBJECTS OF THE INVENTION

It is therefore an object of the invention to overcome the problems involved in the existing PCB working machines referred to above. Specifically, an object of the invention is to provide a PCB working machine that makes it possible to easily adjust the length of extension of the cutting edge of a cutting tool such that the cutting edge can always follow changes in level of a surface to be worked to ensure a constant cutting depth anywhere of the surface.

Another object of the invention is to provide a PCB working machine capable of maintaining a constant length of extension of the cutting edge, without affection by heat-induced displacement of the spindle.

Still another object of the invention is to provide a PCB working machine which removes adverse affection of shavings to a circuit pattern after worked.

Yet another object of the invention is to provide a method for precise and easy adjustment of the length of extension of the cutting edge.

Yet another object of the invention is to provide a PCB working machine in which replacement of cutting tools can be automated and the cutting tool can reliably be returned into a tool holder when a cutting process is finished.

Yet another object of the invention is to provide an unmanned driving method which automatically replaces a cutting tool with a new one, when any damage is detected during a cutting process, and then continues the interrupted cutting process from a step in which the damage was detected.

SUMMARY OF THE INVENTION

A first aspect of the invention is a PCB working machine which includes a work table for supporting a PCB substrate in place with a suction force, a spindle carrying a cutting tool fixed thereto, and control means for moving the spindle in accordance with a predetermined pattern, and which is characterized in including: a chuck provided at a distal end of the spindle to clamp the cutting tool; a floating head encircling the chuck at a distance therefrom and having an end plate in which a plurality of air blowing holes are provided; and adjusting means for adjusting positional relations between the floating head and the cutting tool clamped by the chuck.

A second aspect of the invention is based on the PCB working machine according to the first aspect of the invention, and it is characterized in that the air blowing holes are in an annular arrangement in a central portion of the end plate of the floating head and that the floating head has evacuation apertures at radially inner and outer portions of the air blowing holes.

A third aspect of the invention is based on the PCB working machine according to the first or second aspect of the invention, and it is characterized in the use of automatic tool replacing means located at a lower location of the working machine to replace a cutting machine with another; cutting tool holder means including a plurality of tool holders provided along the outer periphery of a rotatable table; and rotation control means for rotating the table to bring a selected one of the tool holders to a predetermined position.

A fourth aspect of the invention is a method for adjusting the amount of extension of the cutting edge in the PCB working machine according to the first, second or third aspect of the invention, which is characterized in a step of fixing the cutting tool to the chuck of the spindle, a step of detecting the position of the cutting edge of the cutting tool, a step of detecting the position of the floating surface of the floating head, a step of computing a current amount of extension of the cutting edge on the basis of detected values of the positions of the cutting edge and the floating surface of the floating head and then computing a necessary amount of movement of the floating surface, and a step of correcting the amount of extension of the cutting edge by moving the floating head upward or downward in response to a result of the computation.

A fifth aspect of the invention is a method for removing the cutting tool in the PCB working machine according to the first, second or third aspect of the invention, which is characterized in a step of clamping the distal end of the cutting tool with a parallel pull-out chuck, releasing the clamping force of the collet chuck, and pulling out the cutting tool by about 10 mm, and a step of locating a selected one of cutting tool holders beneath the collet chuck and there releasing the clamping force of the collet chuck.

A sixth aspect of the invention is a method for driving the PCB working machine according to the first, second or third aspect of the invention, which is characterized in a step of dividing a working program into a plurality of sequential steps and detecting the position of the cutting edge of the cutting tool in predetermined time intervals, a step of determining on the basis of a result of the measurement whether there is any damage in said cutting tool, and a step of replacing the cutting tool with another and then continuing the working program from one of sequential steps in which the damage was detected when it is determined that there is any damage in said cutting tool.

BRIEF DESCRIPTION OF THE DRAWING

FIGS. 5A–5C show sequential steps of a process for adjusting the extended mount of a cutting edge of a cutting tool in accordance of the present invention;

DETAILED DESCRIPTION OF A PREFERRED EMBODIMENT

An embodiment of the invention is described below with reference to the drawings.

Figure 1A:
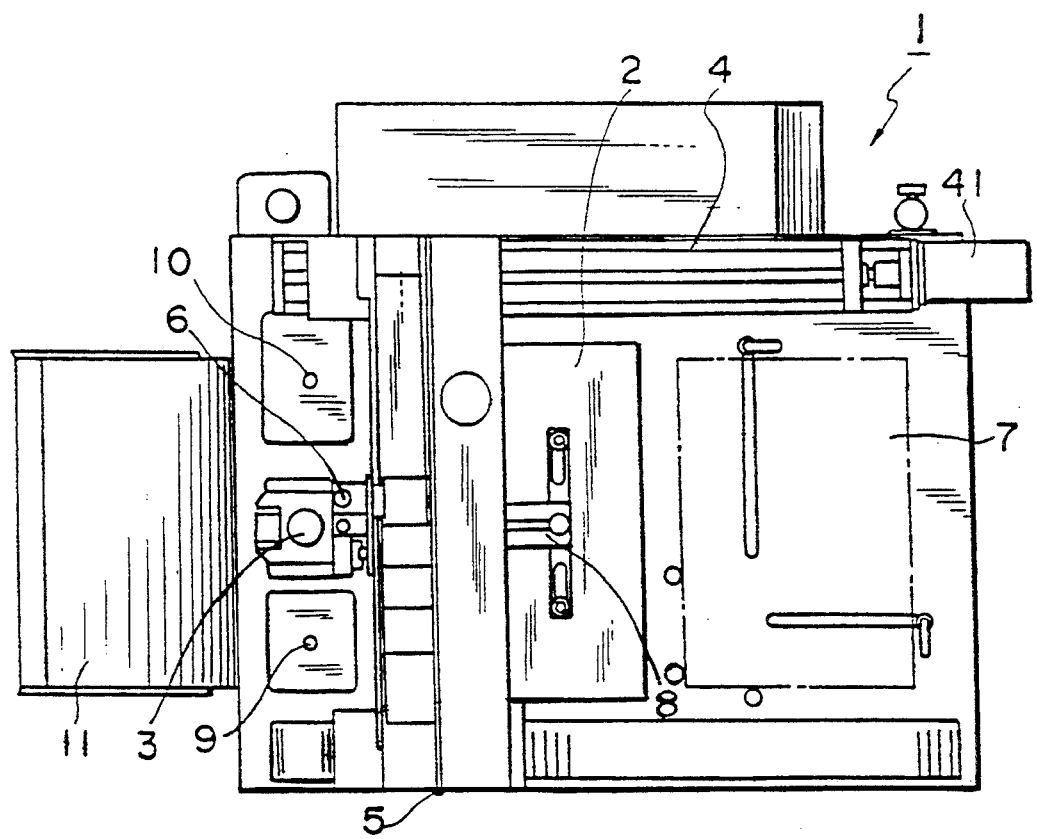
FIG. 1A shows a plan view of a PCB working machine according to the invention.
Figure 1B:
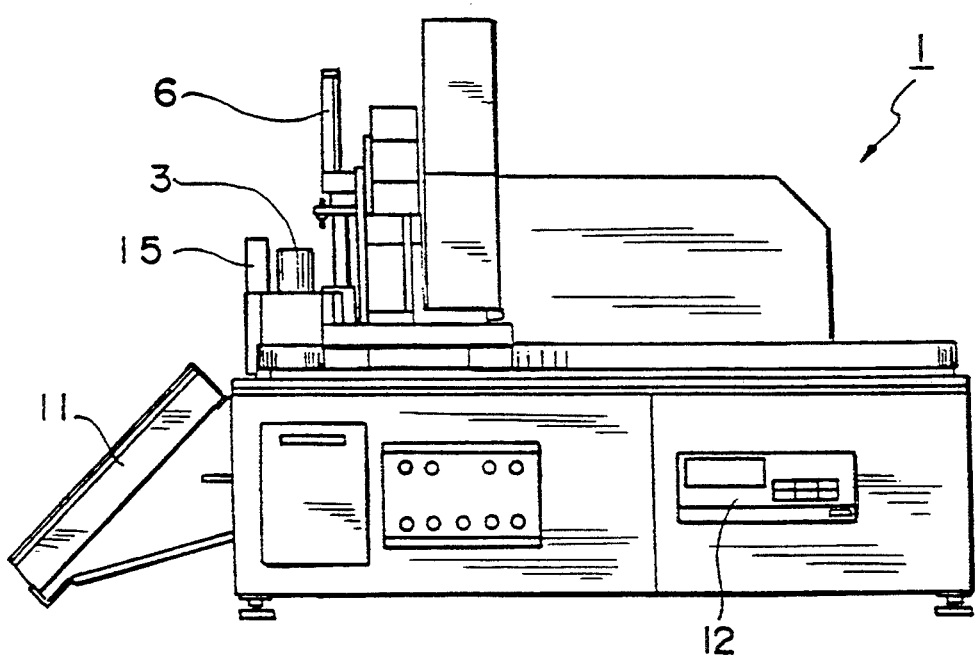
FIG. 1B shows a front elevational view of the PCB working machine shown in FIG. 1A.
Figure 2:
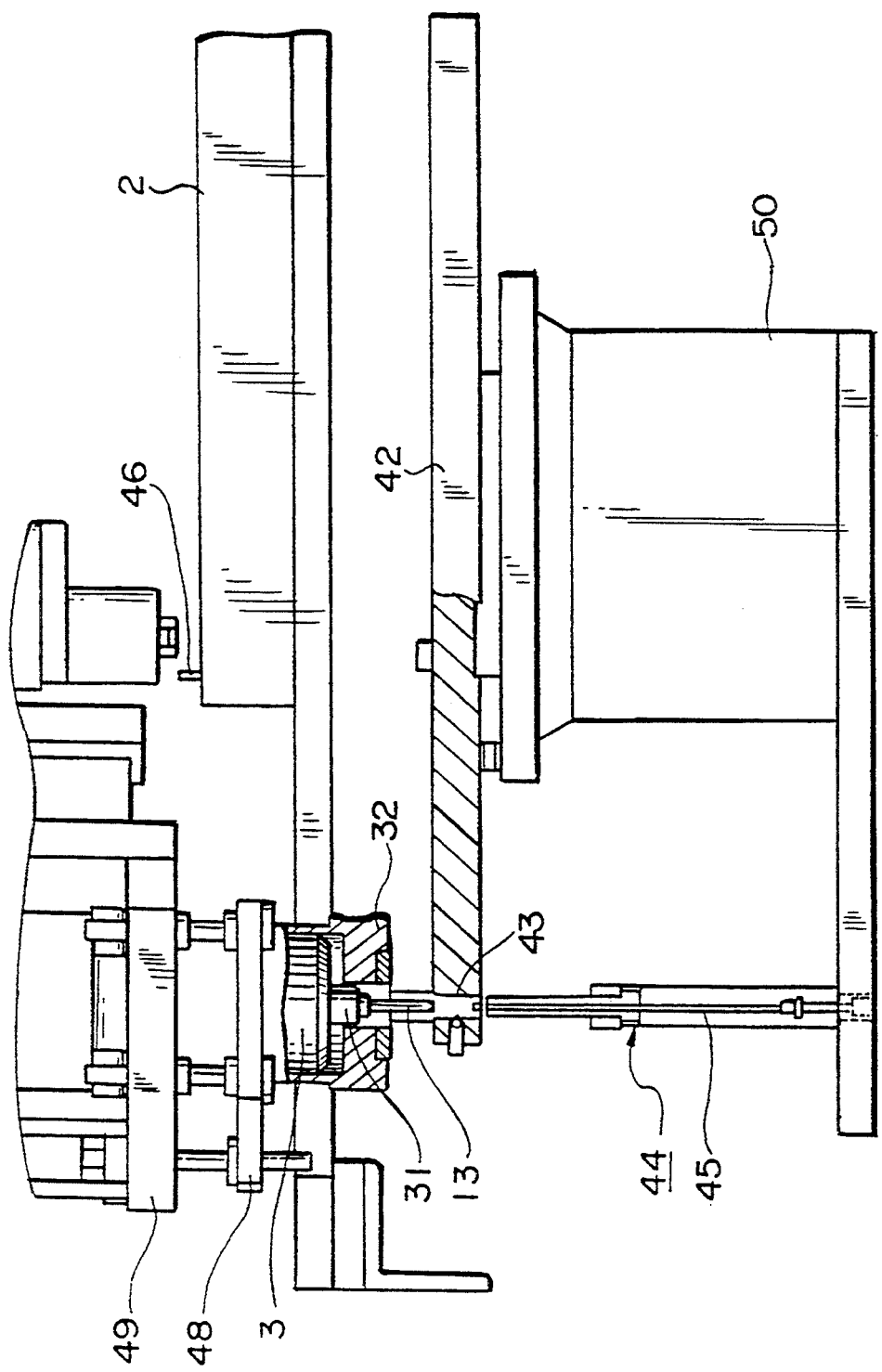
FIG. 2 is a fragmentary enlarged cross-sectional view of the PCB working machine of FIG. 1, in which a cutting tool replacing portion and its peripheral elements are shown.

FIG. 1A shows a plan view of a PCB working machine according to the invention, and FIG. 2B shows a front elevational view of the PCB working machine shown in FIG. 1A. FIG. 2 is a fragmentary enlarged cross-sectional view of a cutting tool replacing portion and its peripheral elements in the same machine.

The PCB working machine 1 includes a work table 2 for supporting a PCB substrate in place with a suction force, a spindle 3 carrying a cutting tool 13 fixed thereto, a support plate 49 carrying the spindle 3 mounted thereto, an X-axis driving device 4 for moving the support plate 49 in the X-axis direction, a Y-axis driving device 5 for moving the support plate 49 in the Y-axis direction, a Z-axis driving device 6 for moving the cutting tool 13 fixed to the spindle in the Z-axis direction, a PCB setting portion 7 for positioning PCB substrates to be worked in place, PCB conveying means 8 for moving each PCB substrate, positioned in place, between the setting portion 7 and the work table 2 and for moving the work table 2 to and from a PCB receiver unit 11, explained later, a linear gauge 9 for measuring positions of a lower surface of a floating head 32 and of the cutting tool 13, a parallel pull-out chuck 10 for pulling out the cutting tool 13 from a collet chuck 31, a receiver unit 11 for storing PCB substrates after worked, and a linear gauge counter 12 for displaying values measured by the linear gauge 9.

The PCB working machine 1 according to the embodiment also includes a controller (not shown) for transferring a PCB substrate from the PCB setting portion 7 to the work table 2 to have it worked in accordance with a program, for rotating the spindle 3 and moving it in the X-, Y-, and Z-axis directions, for selecting a cutting tool 13 and replacing it with another, for adjusting the amount of extension of the cutting edge of the cutting tool 13, and so on. The PCB working machine 1 further includes an index table 42 (see FIG. 2) for storing a plurality of cutting tools and for supplying a selected one of the cutting tools to a tool replacing position in accordance with a program.

Figure 3:
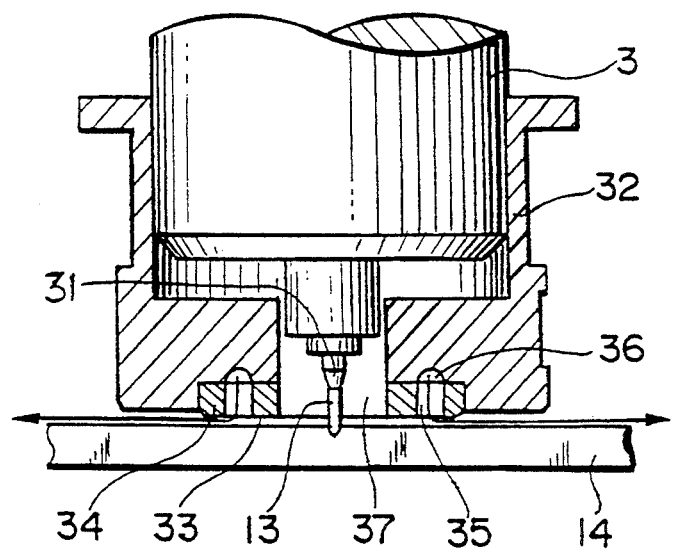
FIG. 3 is a fragmentary enlarged cross-sectional view of the PCB working machine of FIG. 1, in which a cutting tool mounting portion and its peripheral elements are shown.
Figure 4:
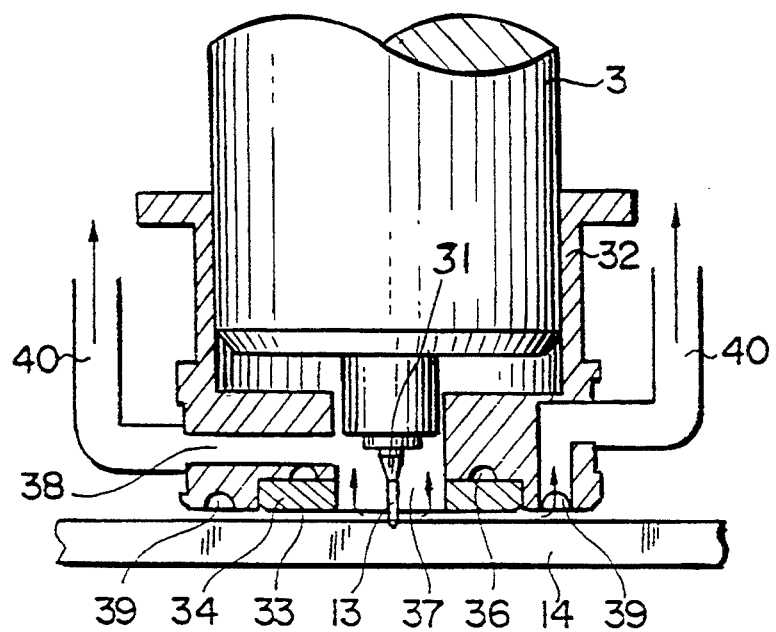
FIG. 4 is a fragmentary enlarged cross-sectional view of the PCB working machine, which corresponds to FIG. 3 but is partly rotated.

As shown in FIGS. 3 and 4, which are enlarged cross-sectional views of a head portion of the spindle 3, the PCB working machine 1 according to the invention is characterized in having a collet chuck 31 provided at a lower end of the spindle 3 for clamping and fixing the cutting tool 13, and a floating head 32 mounted on the spindle 3 so as to encircle the collet chuck 31 and to be vertically moved such that the level of its bottom surface (floating surface) 33 changes to adjust the amount of extension of the cutting edge of the cutting tool 13 from the bottom surface 33.

With reference to FIGS. 1 to 4, more detailed construction and behaviors of the PCB working machine according to the invention are explained below.

A predetermined number of PCB substrates are held in place in the PCB setting portion 7. An uppermost one of the substrates is transferred onto the work table 2 by the PCB conveying means 8 including suction means. Holes for determination of a reference position are made in the PCB substrate on the work table 2 by a drill attached to the spindle 3 in lieu of a cutting tool. The holes engage positioning pins 46 standing from the work table 2 such that the PCB substrate be held in place on the work table 2 with a suction force.

The drill, so far attached to the spindle 3 and used to make positioning holes, will be replaced with a cutting tool 13 in a process explained later, and the PCB held with a suction force in place on the work table will be worked by the cutting tool 13.

As shown in FIGS. 3 and 4, a shank portion of the cutting tool 13 is press-fit into the collet chuck 31 at the lower end of the spindle 3. As a result, the cutting tool 13 is encircled by the floating head 32. The floating head 32 is mounted on the spindle 3 such that its level relative to the level of the cutting tool 13 can be changed by a ball bearing screw 16 driven by a stepping motor 15 in order to adjust the amount of extension of the cutting edge of the cutting tool 13 from the floating surface 33 of the floating head 32.

The floating head 32 has an annular recess in the floating surface 33 at its lower end. The recess contains a floating head block 34 having a plurality of air blowing holes at rotationally spaced positions. The air blowing holes 35 communicate with an air supply groove 36 supplied with compressed air through the floating head 32 from a compressed air source (not shown) to blow out compressed air from the floating surface 33 to produce a thin layer of air between the floating surface 33 and the PCB substrate 14.

The thickness of the air layer changes in dependence of the Z-axis-directional pressing force, the weight of the spindle assembly, the area of the floating surface 33, the amount of air blown out from the air blowing holes 35, and so on, and it can be controlled, as desired, by adjusting the pressing force and the amount of air blow. By adjustment of the thickness of the air layer, the floating surface can be moved up or down, which results in adjusting the amount of extension of the cutting edge from the floating surface. As a result, the depth of cuts into the PCB substrate 14 by the cutting tool 13 can be controlled with a high accuracy. The thickness of the air layer can be controlled in the range of several $\mu m$ to ten and several $\mu m$.

Since the floating surface 33 is held above the surface of the PCB substrate 14 with a controlled thickness of the air layer interposed, the cutting tool 13 follows the surface of the PCB substrate even when the surface includes unevenness, and makes cuts of a constant width anywhere of the uneven surface.

Located under a moving range of the work table 2 and the spindle 3 is an automatic cutting tool replacing assembly which is rotated by a driver means provided in an index portion 50. The cutting tool replacing means includes an index table 42 having thirty-six tool holders 43, for example, provided along its outer circumferential edge, for example, a tool lifting mechanism 44 located at a tool replacing position for lifting a cutting tool 13 contained in one of the tool holders 43 brought thereabove, and a lifting pin 45 provided in the tool lifting mechanism 44.

The tool holders 43 contain a drill for making holes and different types of cutting tools, such as end mills for making grooves, and so on. The index table 42 is rotated to bring a selected one of the tool holders 43 containing a desired cutting tool to the tool replacing position in accordance with a working program. At this time, the spindle 3 is also located above the replacing position. After the cutting tool 13 and the spindle 3 are located at the tool replacing position, the lifting pin 45 of the tool lifting mechanism 44 pushes the cutting tool 13 upward until the shank portion of the cutting tool 13 press-fits into the collet chuck 31 at the lower end of the spindle 3. After that, when the shaft portion of the collet chuck 31 is pulled up, it is fastened by the collet 30 engaging the outer circumference thereof to tightly clamp the cutting tool 13 (see FIG. 6).

FIG. 4 is a cross-sectional view of a shaving removing mechanism, taken along a surface which is slightly rotated from the cross-sectional surface of FIG. 3.

With reference to FIG. 4, the wall of the floating head 32 defining a central bore 37 thereof has an evacuating duct 38 communicating with an evacuator (not shown) through an evacuating pipe 40.

The same wall of the floating head 32 also has an evacuating annular groove 39 which opens to the bottom surface of the floating head 32 around the floating head block 34 and communicates with the evacuating pipe 40 such that the evacuator (not shown) evacuates air through the groove 39 and the pipe 40.

With this construction, since shavings produced during a cutting process by the cutting tool 13 are removed by evacuation through the evacuating duct 38 and the evacuating annular groove 39, it is prevented that shavings are dragged on the surface of a workpiece, damage the worked surface, or cut lines of a circuit pattern obtained by the cutting process.

With reference to FIGS. 5A–5C, a process for adjusting the amount of extension of the cutting edge of the cutting tool 13 is explained below.

FIG. 5A shows a status where a desired cutting tool 13 is tightly clamped by the collet chuck 31 at the tool replacing position. A stepping motor 15 for driving the floating head 32 is mounted on the support plate 49 to which the spindle 3 is fixed. Secured to a rotating shaft of the stepping motor 15 is a male screw which is combined with a female screw provided in the floating head support plate 48 to make up the ball bearing screw 16 and to adjust the vertical position of the floating head 32 by guidance of a guide pin provided on the spindle support plate 49.

FIG. 5B shows a status where the spindle 3 has moved upward of the linear gauge 9. Here the distal end of the cutting tool 13 tightly clamped by the collet chuck 31 at the lower end of the spindle 3 is pressed to a distal end of the linear gauge 9. Accordingly, the linear gauge 9 detects a current position of the cutting edge and gives corresponding data to computing means (not shown).

Next, as shown in FIG. 5C, the linear gauge 9 contacts the floating surface 33 to detect its current position, and gives corresponding data to the computing means.

The computing means computes a current amount of extension of the cutting edge on the basis of the data on the position of the cutting edge and the data on the position of the floating surface 33, and outputs a signal for driving the stepping motor 15 to establish an amount of extension of the cutting edge predetermined by a working program.

The stepping motor 15 effects a predetermined number of rotation in response to the signal to move the floating head support plate 48 by a predetermined distance to move the floating surface 33 to a level to have the cutting edge extend by a predetermined amount from the floating surface 33.

With reference to FIGS. 6A-6E which show cross sectional views of the collet chuck 31, a process for removing the cutting tool 13 during replacement thereof is explained below.

Figure 6A:
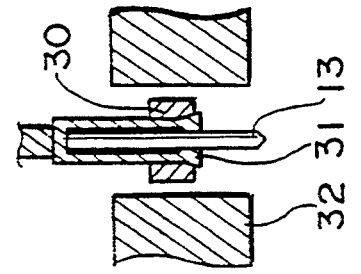
FIGS. 6A–6E show sequential steps of a process for removing the cutting tool from the chuck in accordance with the present invention.

FIG. 6A is a status of the collet chuck 31 at the end of a cutting process. The shank portion of the cutting tool 13 press-fitted into the collet chuck 31 has been tightly clamped by the collet chuck 31 at the lower end of the spindle 3 by pulling up the shaft portion such that the collet 30 tightly squeezes the conical lower end of the shaft portion.

Once the cutting tool 13 is tightly held by the collet chuck 31 in this status, it may stick to the inner surface of the collet chuck 31. In this event, even when the clamping force of the collet chuck 31 is removed by moving the shaft portion thereof downward, the cutting tool fails to automatically drop down from the collet chuck 31, and cannot be removed automatically.

Figure 6B:
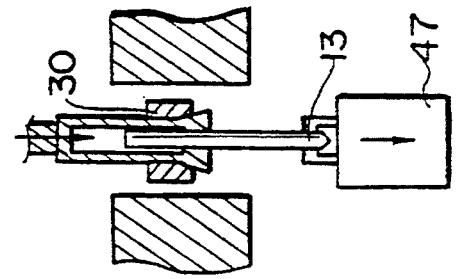

FIG. 6B is a step for removing the cutting tool 31. That is, a parallel pull-out chuck 47 is elevated from beneath the cutting tool 13, and the clamping force by the collet 30 is released. After that, the parallel pull-out chuck 47 clamps the distal end of the cutting tool 13 and pulls it down by several to ten and several millimeters. Thus the cutting tool 13 is detached from the collet chuck 31.

Figure 6C:
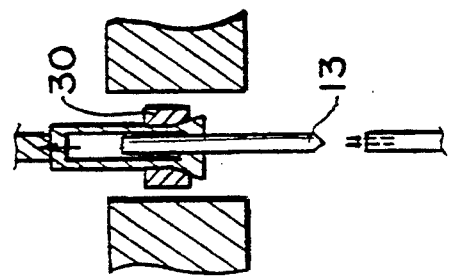

FIG. 6C is a status where the collet 30 again moderately tightens the shaft portion of the collet chuck 31. In this status, compressed air is blown to the distal end of the cutting tool 13 loosely clamped by the collet chuck 31 to clean the cutting edge.

Figure 6D:
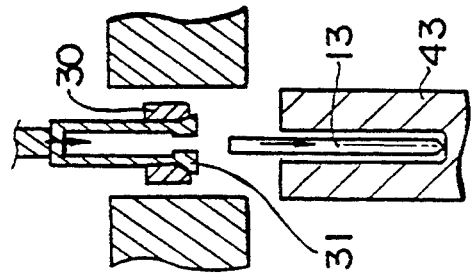
Figure 6E:
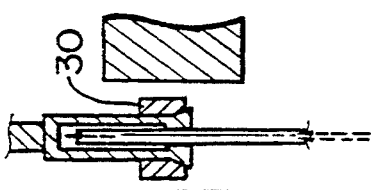

Next, the spindle 3 moves to the tool replacing position. Then, as shown in FIG. 6D, the collet 30 of the collet chuck 31 is moved up to release the clamping force to the cutting tool 13. As a result, the cutting tool 13 automatically drops onto the tool holder 43 with its own weight, and automatic removal of the cutting tool is finished. FIG. 6E is a status where the interior of the collet chuck 31 is cleaned. That is, an air supply tube is inserted into the collet chuck 31 from the lower end thereof, and compressed air supplied therethrough cleans the interior.

With these steps, the process of removing the cutting tool is completed.

Figure 7:
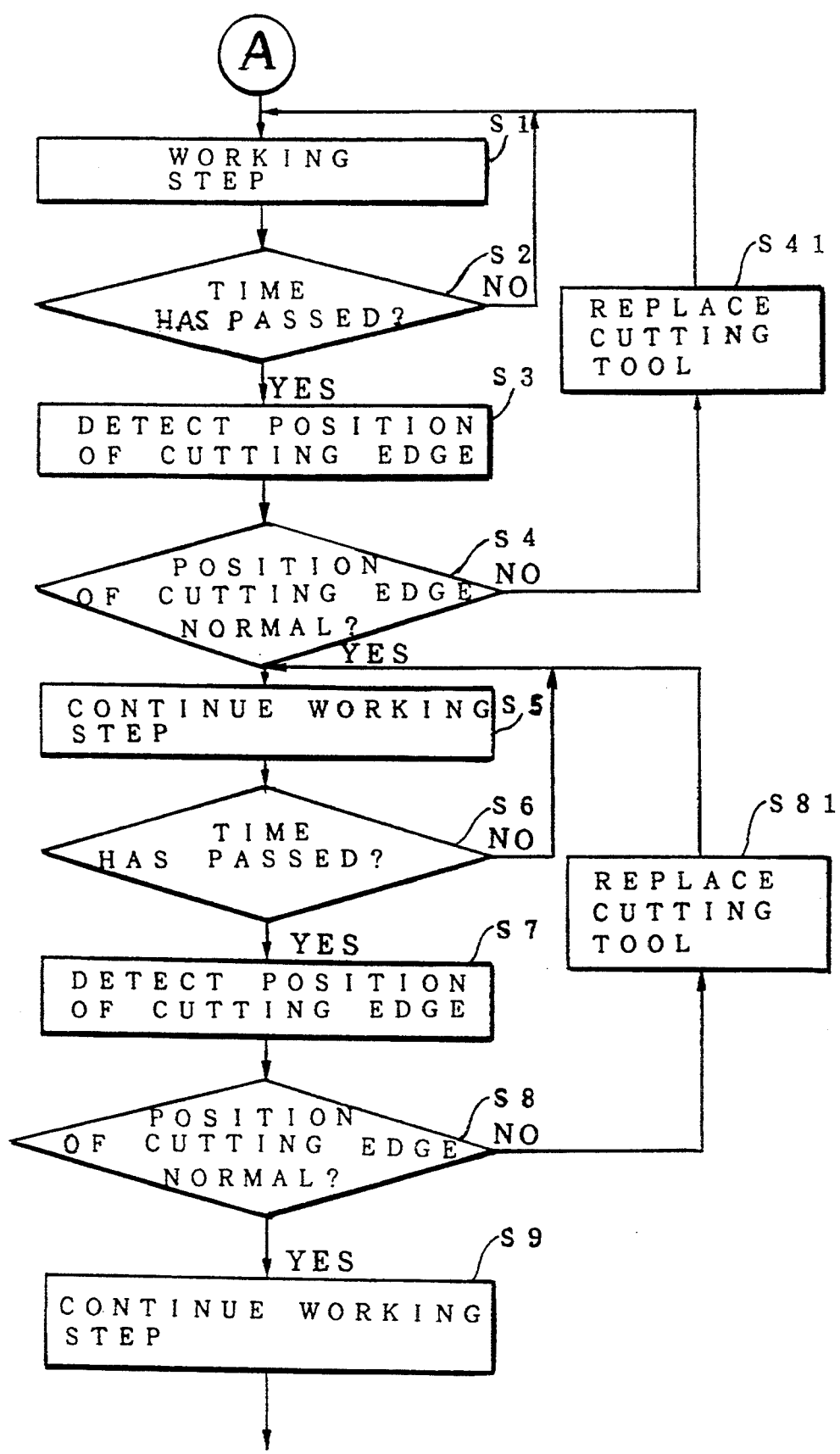
FIG. 7 is a flow chart of a working method using a PCB working machine according to the present invention.

Explained below, with reference to FIG. 7, is a countermeasure to a damage to the cutting tool 13 during a cutting process.

This is a method for preventing defective cuts even when a damage occurs to the cutting tool during an automatic operation of the equipment. This method divides a working program (cutting process) into a predetermined number of working steps (or a predetermined number of time fragments) and determines in each of the working steps whether the position of cutting edge is normal or not. When any abnormality of the cutting edge is detected in a working step, the working is interrupted, and the cutting tool is replaced with another. After that, the working is restarted from the beginning of the divisional step in which the abnormality was detected.

More specifically, a working step is executed (S1). Every time when each working step finishes, it is determined whether a predetermined length of time has passed (S2). If the time has not passed, a next working step is executed. If the time has passed, the position of the cutting edge is detected by the aforementioned method for detecting the amount of extension of the cutting edge (S3). On the basis of the detected value of the position of the cutting edge, it is determined whether the position is normal or not (S4). If there is any abnormality in the position of the cutting edge, which means a possibility of the cutting tool being damaged, the cutting tool is removed by the aforementioned method of removing the cutting tool, and replaced with another (S41). After that, the working is restarted from the beginning of the working step of the divisional working sequences in which the damage to the cutting tool was detected (S1).

When no abnormality is detected in the cutting edge, the working goes to a next divisional working sequence (S5). Also in this divisional working sequence, the position of the cutting edge is monitored (S7) every time when a predetermined length of time passes (S6), in the same manner as the foregoing occurrence, to determine whether the cutting edge is normal or not (S8). If it is normal, the working goes to a next working sequence to execute the next part of the working (S9). If there is any abnormality in the cutting edge, the cutting tool is replaced with another (S81) in the same manner as the foregoing sequence, and thereafter, the working is restarted from the beginning of the step of the working sequences in which the damage to the cutting tool was detected.

By providing the countermeasure described above, even when the PCB working machine is driven in unmanned automatic operation, the cutting edge is checked from time to time, so as to automatically interrupt the working when a damage or other trouble to the cutting edge is detected, to replace the cutting tool by another, and then to continue the working from the beginning of the working sequence.

The step, to which the working process is returned back after detection of a trouble in the cutting edge and after replacement of the cutting tool, is not limited to that explained with reference to the embodiment. It is only required to be a step immediately after previous detection of the proper position of the cutting edge.

As described above, the invention controls the depth of cuts by a PCB working machine by using a layer of air produced by blowing compressed air. Therefore, even if a PCB substrate has an unevenness on its surface, it is possible to have the floating surface reliably follow the unevenness and to always position the cutting tool such that a constant depth of cuts is maintained. Therefore, a PCB substrate having a microscopic circuit pattern with lines distant by 0.25 mm or so can be obtained.

In addition, since the invention uses an evacuating mechanism in the floating head, shavings can be removed from worked portions on a PCB substrate in a reliable and quick manner. Therefore, the invention removes causes of defective cuts, such as breakage of the circuit pattern by shavings, and thereby increases the working efficiency.

The invention enables automatic and precise adjustment of the amount of extension of a cutting edge on the basis of a working program.

The invention can automatically remove a cutting tool even when sticking to an inner surface of the chuck.

The invention also prevents defective cuts even during unmanned operation of the PCB working machine by automatically replacing a broken cutting tool with another and thereafter resuming the working from a point preceding the breakage of the cutting tool.

In conclusion, the invention provides PCB working machines adaptive to fabrication of highly integrated PCB substrates and adaptive to fully unmanned operation by combining two or more of aspects of the invention.

What is claimed is:

1. A PCB working machine, comprising:
   a work table for holding a PCB substrate;
   a spindle having a distal end and a chuck provided at said distal end for carrying a tool for cutting the PCB substrate;
   control means for moving the spindle in accordance with a predetermined pattern;
   a floating head encircling said chuck at a distance therefrom for adjusting a depth of a cut made with the cutting tool into the PCB substrate, said floating head having an end plate defining a floating surface, and the amount of extension of a cutting edge of the cutting tool from said floating surface determining the depth of the cut made by the cutting tool into the PCB substrate;
   means for floating said floating head above the PCB substrate during cutting of the PCB substrate by forming an air layer between said floating surface and the PCB substrate, said floating means including hole means formed in said end plate of said floating head for blowing air therethrough;
   means for adjusting the positional relationship between said floating surface and a cutting edge of the cutting tool and means for adjusting the positional relationship between said floating surface and said PCB substrate.

2. A PCB working machine according to claim 1, wherein said air blowing hole means comprises a plurality of holes disposed in an annular arrangement on said end plate of said floating head, and wherein said end plate has aperture means provided radially inward of said holes for evacuating shavings through said aperture means.

3. A PCB working machine according to claim 1, further comprising:
   tool means for automatically replacing one cutting tool with another cutting tool;
   a rotatable table;
   a plurality of cutting tool holders provided along a circumference of said rotatable table; and
   means for rotating said rotatable table to bring a selected one of the plurality of cutting tool holders to a predetermined position beneath said chuck.

4. A method of adjusting an amount of extension of a cutting edge of a cutting tool from a floating surface of a floating head which floats on a layer of blown air above a workpiece surface and which surrounds a cutting tool retaining chuck provided at a distal end of a spindle of a PCB working machine and which is spaced from a work table of the PCB working machine, said method comprising the steps of:
   fixing the cutting tool in the chuck;
   detecting a position of the cutting edge of the cutting tool;
   detecting a position of the floating surface of the floating head; and
   determining an amount of extension of the cutting edge of the cutting tool from the floating surface of the floating heads in accordance with the detected positions of the cutting edge and the floating surface;
   determining a difference between the determined amount of extension of the cutting edge from the floating surface and an amount of extension of the cutting edge from the floating surface, which is predetermined by a working program, and generating a control signal;
   displacing said floating head in one of upward and downward directions in accordance with the control signal to establish the predetermined amount of extension of the cutting edge of the cutting tool from the floating surface of the floating head and displacing said floating surface of said floating head relative to the workpiece surface.

* * * * *